United States Patent
Golnabi (10) Patent No.: US 6,341,362 B1
(45) Date of Patent: Jan. 22, 2002

(54) EXTENDED SYMBOL GALOIS FIELD ERROR CORRECTING DEVICE

(75) Inventor: Habibollah Golnabi, Plano, TX (US)

(73) Assignee: VLSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/298,225

(22) Filed: Apr. 22, 1999

(51) Int. Cl.[7] .......................... H03M 13/00; G06F 11/00
(52) U.S. Cl. ...................................... 714/784; 714/800
(58) Field of Search ................................. 714/784, 800

(56) References Cited

U.S. PATENT DOCUMENTS

| | | | |
|---|---|---|---|
| 4,413,339 A | 11/1983 | Riggle et al. ................. | 371/38 |
| 4,777,635 A | 10/1988 | Glover ......................... | 371/40 |
| 5,020,060 A | 5/1991 | Murai et al. ................ | 371/37.1 |
| 5,130,990 A | 7/1992 | Hsu et al. ................... | 371/37.1 |
| 5,323,402 A | 6/1994 | Vaccaro et al. ............ | 371/37.1 |
| 5,535,225 A | * 7/1996 | Mayhew et al. ............ | 714/785 |
| 5,600,659 A | 2/1997 | Chen ........................... | 371/37.1 |
| 5,889,794 A | * 3/1999 | Mo et al. .................... | 714/784 |
| 6,131,178 A | * 10/2000 | Fujita et al. ................ | 714/784 |

OTHER PUBLICATIONS

Shu Lin and Daniel Costello, Jr., "Error control Coding", Prentice Hall 1983.*

Shayan, Y.R.; Le–Ngoc, T. and Bhargava, V.K.; "A versatile time–domain Reed–Solomon decoder", IEEE Journal on Selected Areas in Communications, vol: 8 Issue: 8, Oct. 1990 pp. 1535–1542.*

Shayan, Y.R.; Le–Ngoc, T. and Bhargava, V.K.; "A versatile time domain Reed–Solomon decoder", Global Telecommunications Conference, 1989, and Exhibition. Communications Technology for the 1990s and Beyond. GLOBECOM '89., IEEE 1989, pp. 1088–1092, vol.*

Joiner, L.L. and Komo, J.J.; "Time domain decoding of extended Reed–Solomon codes", Proceedings of the IEEE Southeastcon '96. Bringing Together Education, Science and Techology. 1996 pp. 238–241.*

*On Decoding Doubly Extended Reed–Solomon Code*, Proceedings of the 1995 International Symposium on Information Theory, J.M. Jensen, p. 280, Sep. 1995.

(List continued on next page.)

*Primary Examiner*—Albert Decady
*Assistant Examiner*—Joseph Torres
(74) *Attorney, Agent, or Firm*—Wells, St. John, Roberts, Gregory & Matkin, P.S.

(57) ABSTRACT

An extended symbol Galois field error correcting device is provided. The device includes a singly-extended Reed-Solomon encoder configured to generate an encoded codeword, $\tilde{c}(x)$. The device also includes a channel medium that is signal coupled with the singly-extended Reed-Solomon encoder. The channel medium is configured to receive the encoded codeword, $\tilde{c}(x)$, and output a received input codeword, $\tilde{r}(x)$. The channel medium is capable of introducing error, $\tilde{e}(x)$, to the encoded codeword, $\tilde{c}(x)$. The device further includes a singly-extended Reed-Solomon decoder that is coupled with the channel medium. The singly-extended Reed-Solomon decoder is configured to receive the received input codeword, $\tilde{r}(x)$. The singly-extended Reed-Solomon decoder has error detection circuitry and extended symbol correction circuitry. The error detection circuitry is configured to detect presence of error, $\tilde{e}(x)$, within the received input codeword, $\tilde{r}(x)$. The extended symbol correction circuitry is configured to correct the received input codeword, $\tilde{r}(x)$, by computing syndromes of an intermediate output codeword ($c'_j$). A corrected extended parity symbol ($c\_$) is provided such that the corrected extended symbol ($c\_$) is multiplexed with the intermediate output codeword ($c'_j$) to yield a final output codeword, $\tilde{c}=[c\_ c']$.

25 Claims, 4 Drawing Sheets

OTHER PUBLICATIONS

*Time Domain Decoding of Extended Reed–Solomon Codes*, IEEE Transaction on Information Theory, L.L. Joiner, J.J. Komo, pp. 238–241, 1996.

*On MDS Extensions of Generalized Reed–Solomon Codes*, IEEE Transaction on Information Theory, G. Seroussi, R.M. Roth, vol. IT–32, No. 3, pp. 349–354, May 1996.

*The Decoding of Extended Reed–Solomon Codes, Discrete Mathematics 90* (1991), Ä. Dur, pp. 21–40, North–Holland.

*Error Control Coding: Fundamentals and Applications*, Shu Lin and Daniel J. Costello, Jr., Prentice Hall, Inc., 1983.

* cited by examiner

EXTENDED SYMBOL GALOIS FIELD ERROR CORRECTING DEVICE

TECHNICAL FIELD

This invention relates to the detection and correction of digital data, and more particularly, to systems and methods for detecting and correcting errors in digital data with singly-extended Reed-Solomon decoders.

BACKGROUND OF THE INVENTION

Recently, the need has increased for efficient and reliable digital data transmission and storage techniques. The fields of communications and computing have merged such that there exists a great demand for exchanging, processing and storing of digital information with large-scale, high-speed data networks. Even personal computers (PCS) have seen large increases in speed and complexity, and with a coupling to the Internet, have also developed an increased need for apparatus and methods for transferring digital information. A resulting primary concern is the control of errors during exchange, processing and storage of digital information so that data can be reliably reproduced.

As early as 1948, it was shown that error reduction could be realized from a noisy channel or storage medium by properly encoding information. Since this date, a significant amount of effort has been expended on devising ways of efficiently encoding and decoding information so that error is controlled, particularly in noisy environments. More recently, the use of high-speed digital systems has resulted in a need to realize reliable data transmission such that coding/decoding has become a significant factor in the design of modern communication systems and digital computers.

The intercommunication of computers, data processing systems and communications systems occurs via transmission of digital data comprising signals. Digital signals comprise a series of "ones" and "zeros". Transfer of such signals oftentimes subjects the signals to errors resulting from the presence of noise, defects in storage media and defects in the transmission path or data channel extending between an information source and a destination device. Hence, there exists a need to correct for such errors in order that transmitted and stored information is not lost.

One system for detecting and correcting errors in digital information utilizes Reed-Solomon decoders. One relatively recent attempt is evidenced by U.S. Pat. No. 4,413,339 issued to Riggle, et al., wherein an error detecting and correcting system implements Reed-Solomon (1026,1006) code having codewords whose symbols are elements in the Galois field $GF(2^{10})$ generated by either the primitive polynomial $x^{10}+x^3+1$ or $x^{10}+x^7+1$.

However, prior art solutions involving Reed-Solomon decoders generally utilize the following technique. The extended error value (e__) in the extended received-symbol (r__) is calculated by adding the syndrome $(S_{n-k+1})$ of the received input codeword to the computed error values coming out of the RS decoder. That is, $$e_- = s_{n-k+1} + \sum_{j=0}^{n-1} e_j \alpha^{j(n-k+1)}$$

The disadvantage associated with the prior art techniques is that the syndrome value $(S_{n-k+1})$ needs to be buffered until the error values are computed and ready. However, buffering causes the required overall latency and the number of logic elements used to increase.

For additional background information evidencing the state of the art, reference may be had to *Error Control Coding: Fundamentals and Applications*, Shu Lin and Daniel J. Costello, Jr., Prentice-Hall, Inc., Englewood Cliffs, N. J., 1983. Such reference is herein incorporated by reference as evidencing the present state of the art.

For yet additional background information pertaining to extended Reed-Solomon Codes, reference may be had to The Decoding of Extended Reed-Solomon Codes, *Discrete Mathematics* 90 (1991), pp. 21–40, A. Dür, North-Holland. Such reference is herein incorporated by reference as evidencing the present state of the art.

Therefore, additional needs exist to reduce the overall latency and the number of logic elements needed when implementing a singly-extended Reed-Solomon decoder.

SUMMARY OF THE INVENTION

In accordance with the present invention, error correction of an extended symbol in a singly-extended Reed-Solomon decoder is implemented using existing error detection logic elements. The fundamental principles of this invention are that an encoded extended-symbol (c__) is generated by evaluating the encoded codeword, c(x), for $\alpha^{(n-k+1)}$. The final encoded codeword, c̃=[c__c], is transmitted to a standard RS decoder which is used to correct the received input codeword, r̃=[r__r], excluding the extended symbol, r__. By computing the syndromes of the intermediate output codeword (c'$_j$) of the standard RS decoder, it turns out that the corrected extended-symbol (c__) is in the $(S_{n-k+1})$ output syndrome register and is latched on the (n−1)th (one before the last) clock cycle. During the (n)th (last) clock cycle, the corrected extended-symbol (c__) is multiplexed with the intermediate output codeword (c'$_j$) to yield the final output codeword, c̃=[c__c].

The goal of this invention is to make use of existing error detection logic while minimizing latency and hardware requirements. For example, a 3 m 2×1 multiplexer can be used with 2 m registers to correct the received extended-symbol.

According to one aspect of the invention, an extended symbol Galois field error correcting device is provided. The device includes a singly-extended Reed-Solomon encoder configured to generate an encoded codeword, c̃(x). The device also includes a channel medium that is signal coupled with the singly-extended Reed-Solomon encoder. The channel medium is configured to receive the encoded codeword, c̃(x), and output a received input codeword, r̃(x). The channel medium is capable of introducing error, ẽ(x), to the encoded codeword, c̃(x). The device further includes a singly-extended Reed-Solomon decoder that is coupled with the channel medium. The singly-extended Reed-Solomon decoder is configured to receive the received input codeword, r̃(x). The singly-extended Reed-Solomon decoder has error detection circuitry and extended symbol correction circuitry. The error detection circuitry is configured to detect presence of error, ẽ(x), within the received input codeword, r̃(x). The extended symbol correction circuitry is configured to correct the received input codeword, r̃(x), by computing syndromes of an intermediate output codeword (c'$_j$). A corrected extended parity symbol (c__) is provided such that the corrected extended symbol (c__) is multiplexed with the intermediate output codeword (c'$_j$) to yield a final output codeword, c̃=[c__c'].

According to another aspect of the invention, a Reed-Solomon decoder is provided. The Reed-Solomon decoder includes error detection circuitry configured to receive an input codeword and operative to detect presence of error within the input codeword. The Reed-Solomon decoder also includes extended symbol correction circuitry that is coupled with the error detection circuitry and configured to correct the input codeword by computing syndromes of an intermediate output codeword. Furthermore, the Reed-Solomon decoder includes a multiplexer that is associated with the extended symbol correction circuitry. The extended symbol correction circuitry causes a corrected extended parity symbol to be provided in an output syndrome register associated with an (n−1)th clock cycle such that, during the (n)th clock cycle, the corrected extended parity symbol is multiplexed with the intermediate output codeword to yield a final output codeword.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
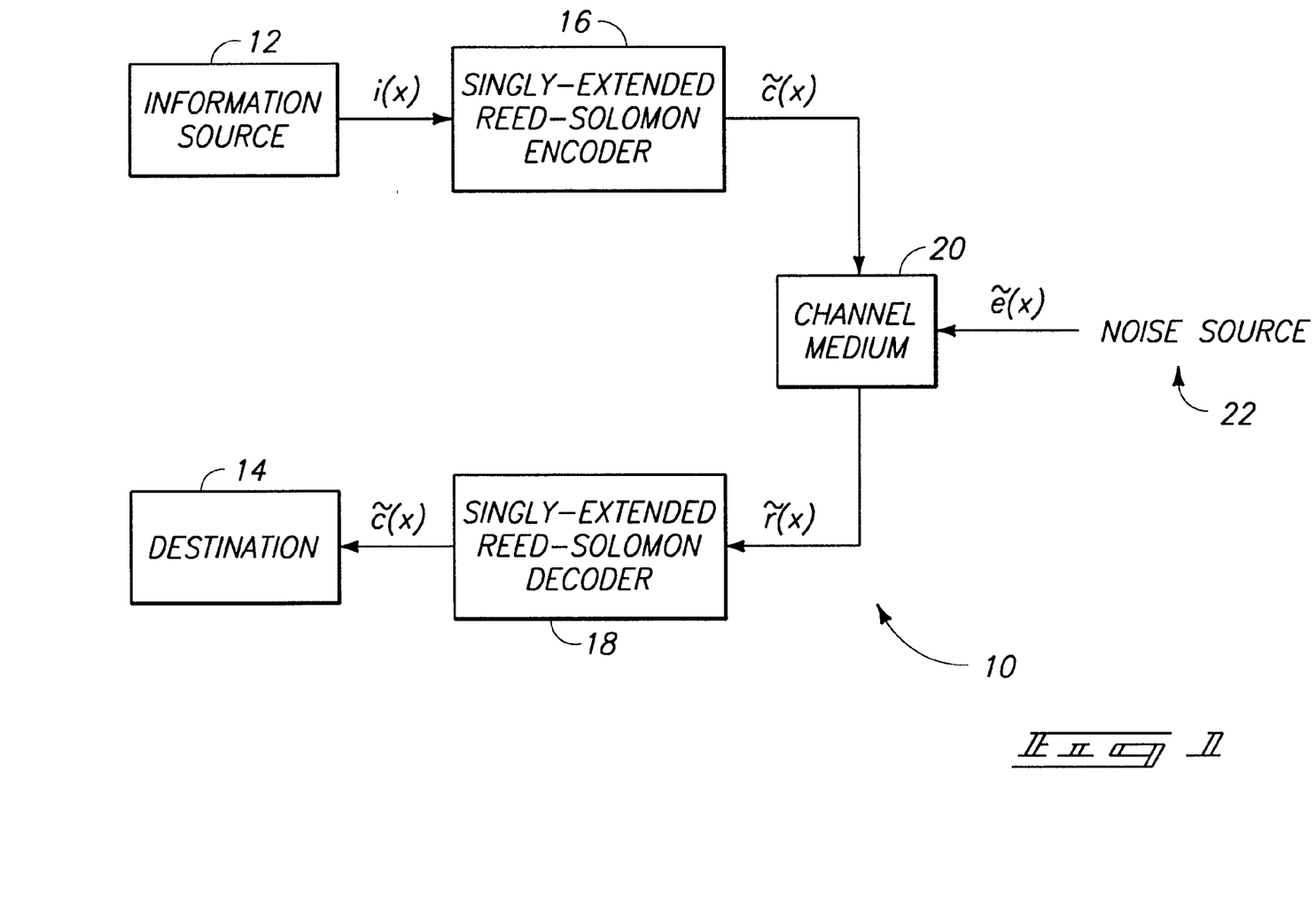
FIG. 1 illustrates in block diagram form one preferred structure of a typical data transmission system having an error correcting and detecting system constructed in accordance with this invention.

FIG. 1 is a schematic block diagram view illustrating a typical data transmission system utilizing Applicant's invention and designated generally with reference numeral 10. Data transmission system 10 is understood to encompass the transmission and storage of digital information between an information source 12 and a destination 14. According to one configuration, information source 12 comprises a digital computer. Alternatively, information source 12 comprises an individual or a machine. According to one implementation, destination 14 comprises a digital computer. Alternatively, destination 14 comprises an individual or a machine.

As shown in FIG. 1, data transmission system 10 includes a singly-extended Reed-Solomon encoder 16, a singly-extended Reed-Solomon decoder 18, and a channel medium 20. Channel medium 20 comprises any one of a number of transmission channels, such as telephone lines, telemetry links, high-frequency radio links, microwave links, satellite links, bus links, and storage medium. Examples of storage medium include core and semiconductor memories, drums, magnetic tapes, disk files, optical memory units, and so on.

In operation, each of the above types of channel medium is subject to potential noise disturbances. For example, on a telephone line, disturbances may result from switching impulse noise, cross-talk from other lines, thermal noise, or lightning. Accordingly, a noise source 22 is represented in FIG. 1 as introducing noise, $\tilde{e}(x)$, into channel medium 20.

As shown in FIG. 1, singly-extended Reed-Solomon encoder 16 encodes data words, or messages, in the form of information polynomials, I(x), emanating from information source 12, as described below in further detail with reference to equation (2). The encoded data words are then transferred through channel medium 20 to destination 18 by way of singly-extended Reed-Solomon decoder 18. In the process of being transferred through channel medium 20, noise can be introduced via channel medium 20. It is understood that singly-extended Reed-Solomon encoder 16 includes a standard Reed-Solomon encoder placed in series with an extended symbol generator.

As shown in FIG. 1, singly-extended Reed-Solomon encoder 16 receives information, or message, polynomial, I(x). In response, singly-extended Reed-Solomon encoder 16 outputs an extended codeword $\tilde{c}(x)$ to channel medium 20. Channel medium 20 then outputs a received input codeword $\tilde{r}(x)$ to singly-extended Reed-Solomon decoder 18. Finally, singly-extended Reed-Solomon decoder 18 outputs the final encoded codeword $\tilde{c}(x)$ to destination 14.

As shown in FIG. 1, singly-extended Reed-Solomon encoder 16 is implemented with Reed-Solomon error correcting codes that are defined over the Galois Field $GF(2^m)$ using a generator polynomial for a Reed-Solomon code as described below in greater detail with reference to equation (1). Such a generator polynomial is described in greater detail in S. Lin, D. J. Costello, Error Control Coding: *Fundamentals and Applications*, New Jersey, Prentice-Hall, 1983, incorporated herein by reference as illustrating the state of the art.

Figure 2:
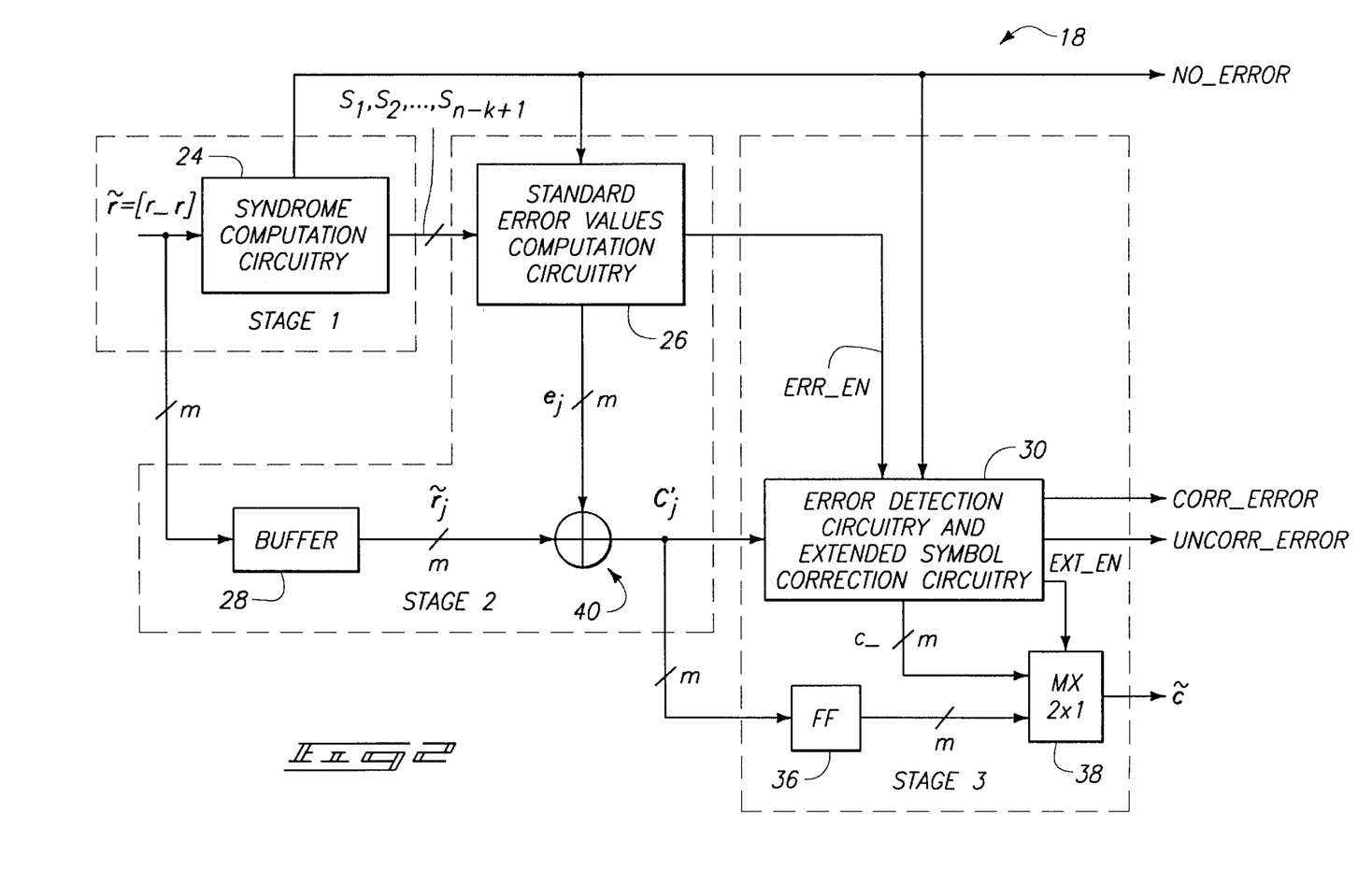
FIG. 2 illustrates in greater detail a general singly-extended Reed-Solomon decoder architecture usable with the structure depicted in FIG. 1.

FIG. 2 illustrates in greater detail the architecture for one implementation of singly-extended Reed-Solomon decoder 18 as used within the data transmission system 10 of FIG. 1. More particularly, a general singly-extended Reed-Solomon decoder architecture is illustrated for decoder 18 in three stages; namely, "STAGE 1", "STAGE 2" and "STAGE 3".

In "STAGE 1", received input codeword, $\tilde{r}=[r\_r]$, is input into syndrome computation circuitry 24. An output signal comprising the syndrome values $(s_1, s_2, \ldots, s_{n-k+1})$ from circuitry 24 is then delivered to standard error values computation circuitry 26 within "STAGE 2". Additionally, the syndrome computation circuitry 24 generates a "NO-ERROR" signal that is input to "STAGE 2" and "STAGE 3".

In "STAGE 2", standard error values computation circuitry 26 receives the output signal comprising the syndrome values $(s_1, s_2, \ldots, s_{n-k+1})$ and generates output signals comprising calculated error values, $e_j$, for $j=0, 1, \ldots, (n-1)$, and an "ERR_EN" signal which will be discussed below in greater detail. "STAGE 2" includes a buffer 28. Calculated error values, $e_j$, are input into an array of m (where m is the number of data bits) 2-input "exclusive-or" (XOR) gates 40 within "STAGE 2". The "ERR_EN" signal is input into circuitry 30 within "STAGE 3". Additionally, XOR gate 40 receives the received vector symbols, $\hat{r}_j$ for $j=0, 1, \ldots, n$. XOR gate 40 generates an intermediate output codeword $c'_j$ that is input to "STAGE 3".

In "STAGE 3", processing circuitry 30 receives a "NO_ERROR" signal, an "ERR_EN" signal and intermediate output codeword $c'_j$. As discussed below in greater detail, processing circuitry 30 includes error detection circuitry and extended symbol correction circuitry that cooperate to generate "CORR_ERROR" and "UNCORR_ERROR" signals. "STAGE 3" also includes an array of m-bit flip-flops 36 which provides a hardware register for latching intermediate output codeword c'$_j$. Processing circuitry 30 also generates an "EXT_EN" signal and an encoded extended symbol c__ using equation (9) as described in greater detail below. The corrected extended symbol c__ is provided in an (s$_{-k+1}$) output syndrome register within the processing circuitry 30 (see FIG. 3), and is latched onto the (n−1)th (one before the last) clock cycle using the "ERR_EN" signal within processing circuitry 30 (see FIG. 3). During the (n)th (last) clock cycle, the corrected extended symbol, c__, is multiplexed via multiplexer 38 with the intermediate output codeword c'$_j$ using the "EXT_EN" signal to yield the corrected extended symbol. The resulting output codeword is $\tilde{c}$.

Figure 3:
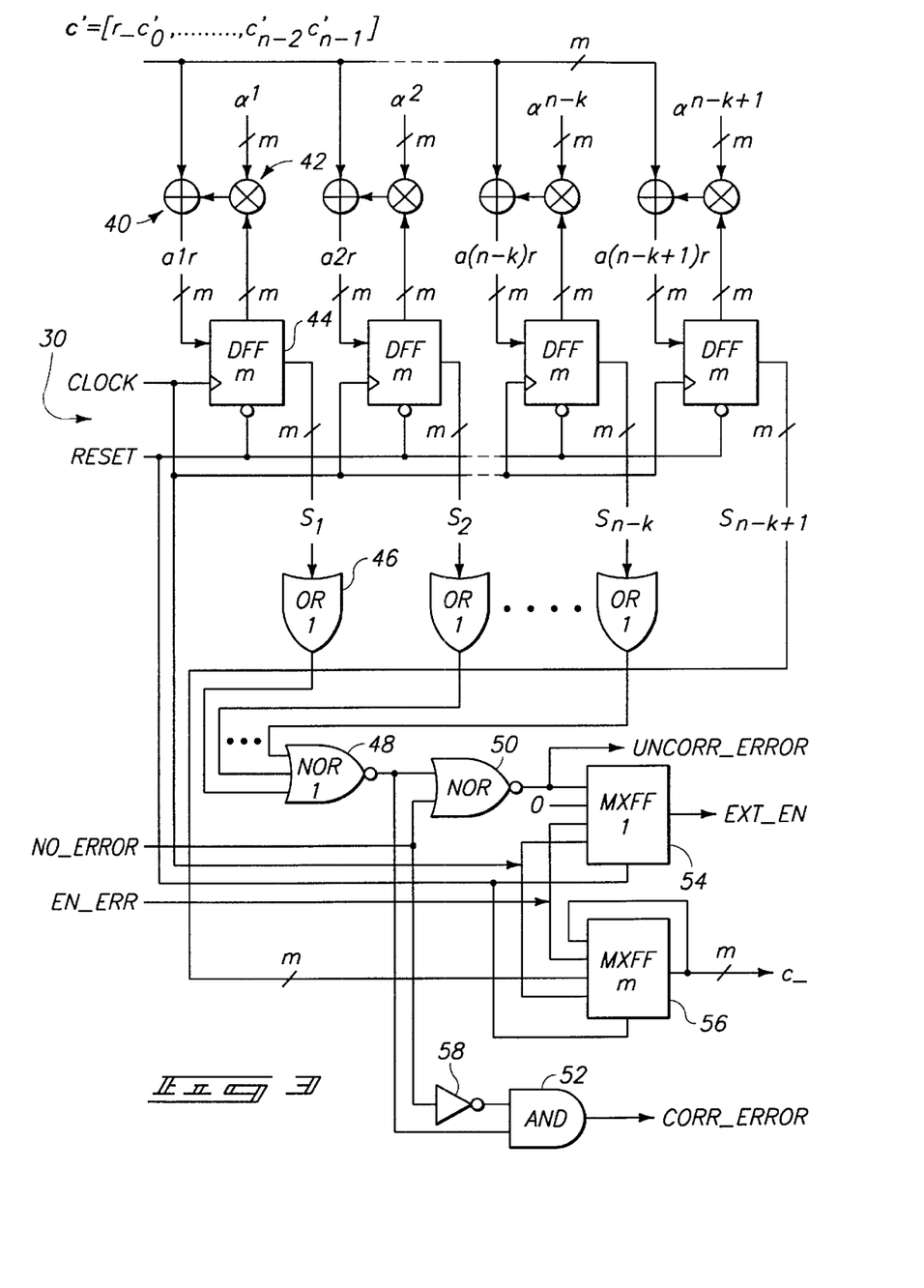
FIG. 3 illustrates a logic diagram of a singly-extended RS(n+1,k) decoder error detection and extended symbol correction output detection circuit.
Figure 4:
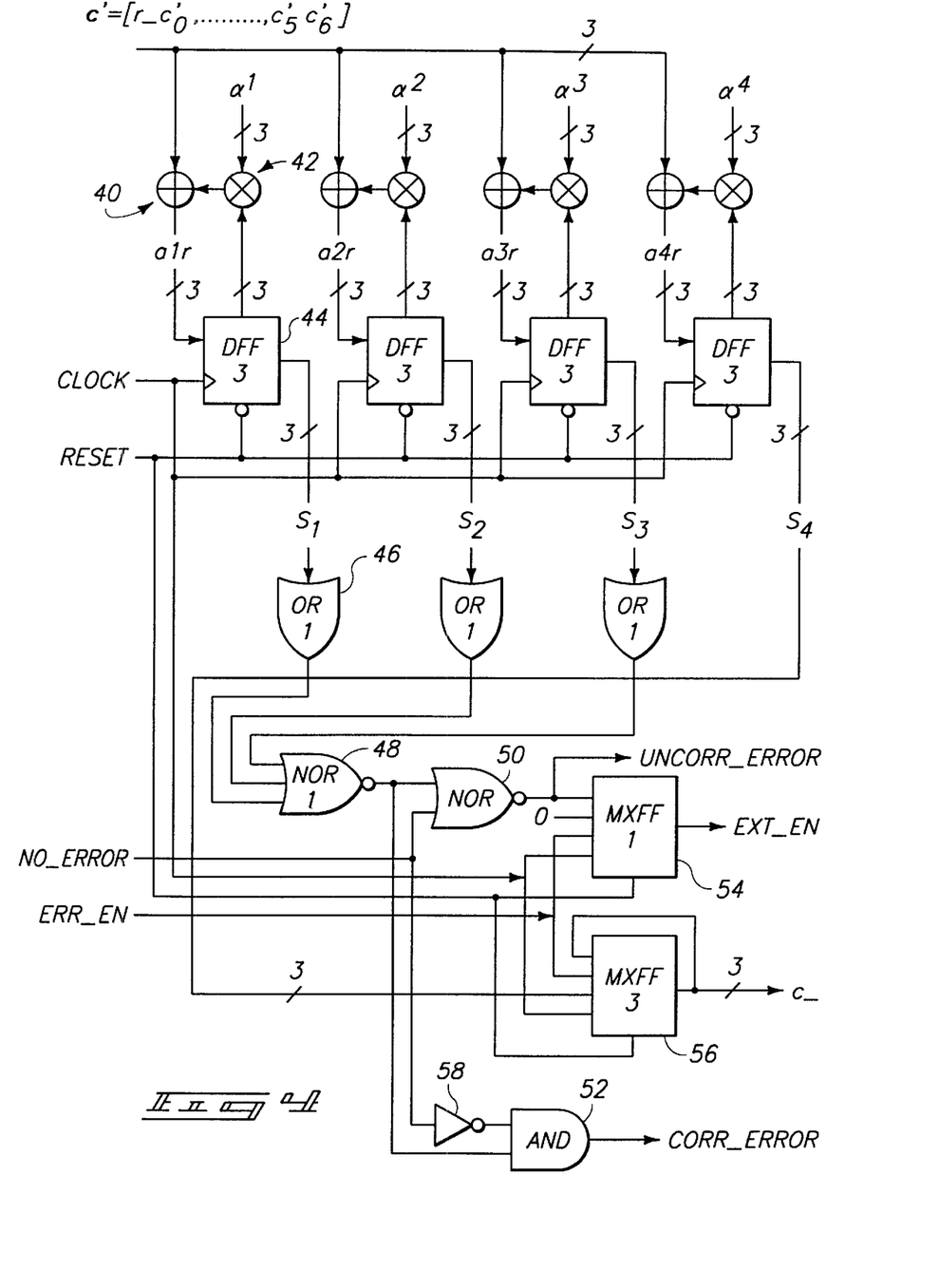
FIG. 4 illustrates a logic diagram of one instance of a singly-extended RS(8,4) decoder error detection and extended symbol correction output detection circuit.

FIG. 3 illustrates in greater detail the logic diagram of the processing circuitry 30, comprising the error detection circuitry and the extended symbol correction circuitry, for the singly-extended Reed-Solomon (RS) decoder 18 of FIG. 2. More particularly, the logic diagram of an RS(n+1,k) decoder error detection and extended symbol correction apparatus is illustrated in FIG. 3. FIG. 4 shows one instance for a singly-extended RS(8,4) error detection and extended symbol correction apparatus.

As shown in FIGS. 3 and 4, circuitry 30 includes an array of XOR gates 40 operatively associated with respective GF(2$^m$) constant multipliers 42 and discrete flip-flops (DFF) 44. Such a generator polynomial is described in greater detail in S. Lin, D. J. Costello, Error Control Coding: *Fundamentals and Applications*, New Jersey, Prentice-Hall, 1983, previously incorporated herein by reference. Additionally, the logic circuitry of circuitry 30 includes an array of associated OR gates 46, NOR gates 48 and 50, AND gate 52, 2×1 multiplexer with a flip-flop (MXFF) 54 and an m-bit 2×1 MXFF 56 and NOT gate 58.

As shown generally above in FIGS. 1-4, Applicant's invention is related to the error correction of an extended symbol in a singly-extended Reed-Solomon (RS) decoder using existing error detection logic elements for forward error correction applications. An encoded extended-symbol (c__) is generated by evaluating the encoded codeword, c(x), at the (n−k+1) power of α. The final encoded codeword, $\tilde{c}$=[c__c], is transmitted to a standard RS decoder which is used to correct the received input codeword, $\tilde{r}$=[r__r], excluding the received extended-symbol, r__. By computing the syndromes of the intermediate output codeword (c'$_j$) of the standard RS decoder, it turns out that the corrected extended-symbol (c__) is in the (s$_{n-k+1}$) output syndrome register and is latched on the (n−1)th (one before the last) clock cycle. During the (n)th (last) clock cycle, the corrected extended-symbol (c__) is multiplexed with the intermediate output codeword (c'$_j$) to yield the final output codeword, $\tilde{c}$=[c__c'], as shown by multiplexer 38 (of FIG. 2).

In prior art applications, the extended error value (e__) in the extended received-symbol (r__) is calculated by adding the syndrome (s$_{n-k+1}$) of the received input codeword to the computed error values coming out of the RS decoder. That is, $$e_- = s_{n-k+1} + \sum_{j=0}^{n-1} e_j \alpha^{j(n-k+1)}$$

However, since the syndrome value (s$_{n-k+1}$) needs to be buffered until the error values are computed and ready, the required overall latency and the logic elements will increase. One goal of Applicant's invention is to use the existing error detection logic of FIGS. 3 and 4 with no added latency and minimal hardware (3 m 2×1 multiplexer and 2 m registers) to correct the received extended-symbol. As shown in greater detail below, a novel algorithm is given for the generalization of any singly-extended RS(n+1, k) decoder followed by several examples.

Algorithm and Architecture

Let GF(2$^m$) be the finite field of 2$^m$ elements. Also, let n=2$^m$−1. The RS error correcting codes are defined over the Galois Field GF(2$^m$).

A. Singly-Extended Reed-Solomon Encoder

The singly-extended Reed-Solomon encoder consists of a standard Reed-Solomon encoder and extended parity symbol generation circuitry.

I. Standard Reed-Solomon Encoder

A generator polynomial for a Reed-Solomon (RS) code is given as $$g(x) = \prod_{i=1}^{n-k}(x + \alpha^i) \tag{1}$$

The information (message) polynomial, i(x), input to the encoder consists of k, m-bit symbols, and is described in greater detail in S. Lin, D. J. Costello, Error Control Coding: *Fundamentals and Applications*, New Jersey, Prentice-Hall, 1983, already incorporated herein by reference.

$$i(x) = \sum_{j=0}^{k-1} i_j x^j \tag{2}$$

The remainder polynomial, p(x), is obtained by:

$$p(x) = \frac{i(x) \cdot x^{n-k}}{g(x)} \tag{3}$$

The remainder polynomial can be rewritten as:

$$p(x) = \sum_{j=0}^{n-k-1} p_j x^j \tag{4}$$

The remainder constitutes (n−k) parity (checkbytes) symbols which are added to the information polynomial i(x) to form an n symbol codeword c(x):

$$c(x) = x^{n-k} \sum_{j=0}^{k-1} i_j x^j + \sum_{j=0}^{n-k-1} p_j x^j \tag{5}$$

$$c(x) = \sum_{j=0}^{n-1} c_j x^j \tag{6}$$

Using equation (6), a valid codeword will have roots at the first through the (n−k) power of α. Using equation (5), the encoder transmits the encoded symbols in the following vector order:

$$c=[p_0 p_1 \ldots p_{n-k-2} p_{n-k-1} i_0 i_1 \ldots i_{k-2} i_{k-1}] \tag{7}$$

or using equation (6), the following result is produced:

$$c=[c_0 c_1 \ldots c_{n-2} c_{n-1}] \tag{8}$$

The order of transmission is right to left.

II. Extended Parity Symbol Generation

An extended parity symbol (c_) is generated by evaluating the codeword c(x) using equation (6) at the (n−k+1) power of α.

$$c\_ = c(\alpha^{n-k+1}) \qquad (9)$$

This extended symbol produces a singly-extended RS(n+1,k) code and is used to form the last symbol of a transmitted RS codeword having a length of (n+1). The extended codeword then appears as follows:

$$\tilde{c}(x) = x \cdot c(x) + c\_ \qquad (10)$$

Using equations (5) and (10), the encoder transmits the enclosed symbols in the following vector order:

$$\tilde{c} = [c\_p_0 p_1 \ldots p_{n-k-2} p_{n-k-1} i_0 i_1 \ldots i_{k-2} i_{k-1}] \qquad (11)$$

or using equations (7), (8), and (11), the following results:

$$\tilde{c} = [c\_c_0 c_1 \ldots c_{n-2} c_{n-1}] = [c\_c] \qquad (12)$$

The order of the transmission is from right to left.

B. Standard Reed-Solomon Decoder

The error-correcting power of an RS(n, k) code is related to t=(n−k)/2 where t is number of bytes which can be corrected per codeword, the difference (n−k) is the number of checkbytes, n is the codeword length, and k is number of information bytes. The RS(n,k) code has a minimum distance of $d_{min} = (n-k)+1$.

Assume that the codeword received by the RS decoder is:

$$r(x) = c(x) + e(x) \qquad (13)$$

or $$r(x) = \sum_{j=0}^{n-1} r_j x^j \qquad (14)$$

where e(x) is the error polynomial and is defined as:

$$e(x) = \sum_{j=0}^{n-1} e_j x^j \qquad (15)$$

r(x) and e(x) can be represented in their vector forms as:

$$r = [r_0 r_1 \ldots r_{n-2} r_{n-1}] \qquad (16)$$

and $$e = [e_0 e_1 \ldots e_{n-2} e_{n-1}] \qquad (17)$$

The syndromes are calculated by evaluating equation (14) at $\alpha^j$, where $\alpha^j$ is an arbitrary Galois Field element:

$$s_j = r(\alpha^j) \text{ where } j=1,2,\ldots,(n-k) \qquad (18)$$

For additional background information evidencing the state of the art, reference may be had to Error Control Coding: *Fundamentals and Applications*, D. J. Costello, S. Lin, New Jersey: Prentice-Hall, 1983. Such reference is previously incorporated herein.

The other way of calculating the syndromes are by using a parity check matrix H which is given in terms of the roots of g(x) as $$H = [\alpha^0 \; \alpha^i \; \alpha^{2i} \ldots \alpha^{(n-2)i} \; \alpha^{(n-1)i}] \text{ where } i=1, 2, \ldots (n-k) \qquad (19)$$

The H matrix for a standard RS code can further be expanded as:

$$H = \begin{bmatrix} 1 & \alpha & \alpha^2 & \circ\circ\circ\circ\circ\circ\circ & \alpha^{n-1} \\ 1 & \alpha^2 & \alpha^4 & \circ\circ\circ\circ\circ\circ\circ & \alpha^{(n-1)2} \\ \circ & \circ & \circ & \circ\circ\circ\circ\circ\circ\circ & \circ \\ \circ & \circ & \circ & \circ\circ\circ\circ\circ\circ\circ & \circ \\ 1 & \alpha^{n-k} & \alpha^{2(n-k)} & \circ\circ\circ\circ\circ\circ\circ & \alpha^{(n-1)(n-k)} \end{bmatrix} \qquad (20)$$

For additional background information evidencing the state of the art, reference may be had to *On Decoding Doubly Extended Reed-Solomon Code*, J. M. Jensen, Proceedings of the 1995 International Symposium on Information Theory, p. 280, September 1995; and *Time Domain Decoding of Extended Reed-Solomon Codes*, L. L. Joiner, J. J. Komo, IEEE Transaction on Information Theory, pp. 238–241, 1996. Such references are herein incorporated by reference as evidencing the present state of the art.

The syndromes of a standard RS decoder are given as:

$$S = rH^T = [S_1 S_2 \ldots S_{n-k}] \qquad (21)$$

Where H is the parity matrix and r is the received codeword given by equation (16). Once the syndromes are known, a standard RS decoder can be used to do the error correction, and to generate the output codeword, $c_j$:

$$c_j = r_j + e_j \text{ where } j=0,1,\ldots,n-1 \qquad (22)$$

C. A Singly-Extended Reed-Solomon Decoder

Since the largest possible minimum distance for an RS(n, k) code is $d_{min} = (n-k)+1$, RS codes are maximum-distance separable (MDS). Singly-extended RS codes retain the MDS property. That is, the minimum distance for RS decoders is $d_{min} > 2t+1$. A singly-extended RS code is an (n+1,k) MDS code and as such the error correcting capability has increased with $d_{min} = (n-k)+2$. The new length is a power of 2.

For additional background information evidencing the state of the art, reference may be had to *On MDS Extensions of Generalized Reed-Solomon Codes*, G. Seroussi, R. M. Roth, IEEE Transaction on Information Theory, vol. IT-32, No. 3, pp. 349–354, May 1996; and The Decoding of Extended Reed-Solomon Codes, *Discrete Mathematics* 90 (1991), pp. 21–40, A. Dür, North-Holland. The first reference above is herein incorporated by reference as evidencing the present state of the art. The second reference above has already been incorporated by reference herein.

Assume that the codeword received by the singly-extended RS decoder is:

$$\tilde{r}(x) = \tilde{c}(x) + \tilde{e}(x) \qquad (23)$$

or $$\tilde{r}(x) = \sum_{j=0}^{n-1} r_j x^j + r\_ \qquad (24)$$

where $\tilde{e}(x)$ is the error polynomial and is defined as:

$$\tilde{e}(x) = \sum_{j=0}^{n-1} e_j x^j + e_- \qquad (25)$$

Using equations (16) and (17), $\tilde{r}(x)$ and $\tilde{e}(x)$ can be represented in their vector forms as:

$$\tilde{r}=[r_- r_0 r_1 \ldots r_{n-2} r_{n-1}]=[r_- r] \qquad (26)$$

and $$\tilde{e}=[e_- e_0 e_1 \ldots e_{n-2} e_{n-1}]=[e_- e] \qquad (27)$$

where r is the received vector symbols and e is the error vector symbols. Also, $r_-$ is the extended received symbol and $e_-$ is the extended error symbol.

The syndromes of the singly-extended RS decoders are calculated using equation (18) along with the extended syndrome given below:

$$S_{n-k+1} = r_- + \sum_{j=0}^{n-1} r_j \alpha^{j(n-k+1)} \qquad (28)$$

The singly-extended RS codes can be derived from the standard RS codes using the following discussions. The parity check matrix $\tilde{H}$ for a singly-extended code is given as:

$$\tilde{H} = \begin{bmatrix} O & H \\ 1 & 1 & \alpha^{n-k+1} & \alpha^{2(n-k+1)} & \circ\circ\circ\circ\circ\circ\circ & \alpha^{(n-1)(n-k+1)} \end{bmatrix} \qquad (29)$$

By using equation (20), the parity check matrix $\tilde{H}$ can further be expressed as:

$$\tilde{H} = \begin{bmatrix} 0 & 1 & \alpha & \alpha^2 & \circ\circ\circ\circ\circ\circ\circ & \alpha^{n-1} \\ 0 & 1 & \alpha^2 & \alpha^4 & \circ\circ\circ\circ\circ\circ\circ & \alpha^{(n-1)2} \\ \circ & \circ & \circ & \circ & \circ\circ\circ\circ\circ\circ\circ & \circ \\ \circ & \circ & \circ & \circ & \circ\circ\circ\circ\circ\circ\circ & \circ \\ 0 & 1 & \alpha^{n-k} & \alpha^{2(n-k)} & \circ\circ\circ\circ\circ\circ\circ & \alpha^{(n-1)(n-k)} \\ 1 & 1 & \alpha^{n-k+1} & \alpha^{2(n-k+1)} & \circ\circ\circ\circ\circ\circ\circ & \alpha^{(n-1)(n-k+1)} \end{bmatrix} \qquad (30)$$

The syndromes of a singly-extended RS decoder are given as $$\tilde{S}=\tilde{r}\tilde{H}^T=[S_1\ S_2\ \ldots\ S_{n-k}\ S_{n-k+1}] \qquad (31)$$

Where $\tilde{H}$ is the parity matrix of a singly-extended RS decoder and $\tilde{r}$ is the received codeword given by equation (26). Comparing the standard RS(n,k) code with the singly-extended RS(n+1, k) code, it can be seen that the singly-extended RS(n+1, k) code has one more extra syndrome namely $S_{n-k+1}$ given by equation (28) or (31) and an extended error symbol, $e_-$.

Once the syndromes, equations (18) and (28), have been calculated, a standard RS decoder can be used to decode a singly-extended RS(n+1, k) code except the extended symbol which is decoded using the following novel technique.

FIG. 2 shows a general architecture for a singly-extended RS(n+1, k) decoder. It consists of three stages.

Stage 1) Syndrome Computation

In this stage, the syndromes are computed using equations (18) and (28) and are fed to stage 2. If the syndromes are all zero, the no error, NO_ERROR, flag will be set. The ERR_EN will be active during the (n-1)th clock cycle if the NO_ERROR flag is not set.

Stage 2) Standard Error Calculations

In this stage, the error vector symbols, $e_j$ for j=0, 1, ..., (n-1), in the received vector symbols, $r_j$ for j=0, 1, ..., (n-1), are found using the standard RS decoder excluding the error value, $e_-$, in the extended symbol, $r_-$. The received codeword, $\tilde{r}=[r_- r]$, is delayed using a buffer and it is aligned with the calculated error values, $e_j$. The intermediate output codeword $c'_j$ is obtained by:

$$c'_j = r_j + e_j \text{ where } j=0, 1, \ldots, (n-1) \qquad (32)$$

Stage 3) Calculation of the Error, $e_-$, in the Extended Symbol, $r_-$

FIG. 3 shows a general logic diagram of the output detection circuit which is modified for the calculation of the error, $e_-$, in the extended symbol, $r_-$. In this stage, the error value, $e_-$, in the extended symbol, $r_-$, is obtained by using the existing output detection logic elements. The procedure is as follows:

i) Calculate the syndromes ($s_1 s_2 \ldots s_{n-k} s_{n-k+1}$) of the output codeword $c'_j$ for j=0, 1, ...,(n-1) using equation (31).

ii) Check the syndromes ($s_1 s_2 \ldots s_{n-k}$) of the output codeword $c'_j$ on the (n-1)th (one before the last) clock cycle:

a) If the syndromes ($s_1 s_2 \ldots s_{n-k}$) are all zero and the NO_ERROR flag is set, then there are no errors in the received codeword, $\tilde{r}_j$ for j=0, 1, ...,n. That is $\tilde{e}_j$ for j=0, 1, ...,n are all equal to zero. This condition causes the ERR_EN to stay inactive in order to keep the EXT_EN low (inactive). The resulting codeword output is:

$$\tilde{c}=[r_- c'_0 c'_1 \ldots c'_{n-2} c'_{n-1}] \qquad (33)$$

b) If the syndromes ($s_1 s_2 \ldots s_{n-k}$) are all zero and the NO_ERROR flag is not set, the correctable error, CORR_ERROR, flag will be set to indicate that t or less errors may have been corrected in the received codeword, $\tilde{r}_j$ for j=0, 1, ...,n, excluding the error value, $e_-$, in the extended symbol, $r_-$. By definition, the encoded extended symbol $c_-$ using equation (9) was found to be $c_-=c(\alpha^{n-k+1})$. This means that the corrected extended symbol $c_-$ is in the ($s_{n-k+1}$) output syndrome register and is latched on the (n-1)th (one before the last) clock cycle using the ERR_EN signal. During the (n)th (last) clock cycle, the corrected extended symbol, $c_-$, is multiplexed with the intermediate output codeword $c'_j$ using the EXT_EN signal to yield the corrected extended symbol. The resulting output codeword is then:

$$\tilde{c}=[c_- c'_0 c'_1 \ldots c'_{n-2} c'_{n-1}] \qquad (34)$$

c) If the syndromes ($s_1 s_2 \ldots s_{n-k}$) are not all zero, then the uncorrectable error, UNCORR_ERROR, flag will be set to indicate that the error(s) in the input codeword, $\tilde{r}_j$, (excluding the error value, $e_-$, in the extended symbol, $r_-$) could not be corrected since there were more than t errors. This condition causes the ERR_EN to stay inactive in order to keep the EXT_EN low (inactive). In this case, the extended symbol would be the input codeword extended symbol $r_-$. The final output codeword would then be:

$$\tilde{c}=[r_- c'_0 c'_1 \ldots c'_{n-2} c'_{n-1}] \qquad (35)$$

In the following section, several examples of singly-extended RS(8,4) code are given. FIG. 4 shows the logic diagram of the singly-extended RS(8,4) decoder output detection and extended symbol correction. The generator polynomial used in these examples is found using equation (1).

$$g(x) = \prod_{i=1}^{3}(x+\alpha^i) = (x+\alpha)(x+\alpha^2)(x+\alpha^3) \quad (36)$$

The primitive polynomial used to form the GF(8) is $\rho(x)=x^7+x^3+1$ where $\rho(\alpha)=0$.

Suppose that the information polynomial is $$i(x)=x^3 \quad (37)$$

Using equation (3), the remainder polynomial can be found as $$p(x)=\alpha x^2+x+\alpha^2 \quad (38)$$

Using equation (5), the input codeword is:

$$c(x)=x^6+\alpha x^2+x+\alpha^2 \quad (39)$$

Using equations (9) and (39), the extended symbol is:

$$c\_=c(\alpha^3)=\alpha^6 \quad (40)$$

This extended symbol is used to form the last symbol of a transmitted Reed-Solomon codeword having length of 8 which produces an RS(8,4) code. Using equation (10), the extended codeword then appears as follows:

$$\tilde{c}(x)=x^7+\alpha x^3+x^2+\alpha^2 x+\alpha^6 \quad (41)$$

or in vector form using equation (12) (the order of transmission is from right to left):

$$\tilde{c}=[\alpha^6\alpha^21\alpha0001] \quad (42)$$

EXAMPLES

Case 1) A singly-extended RS(8,4) Code with No Error

Suppose that the received codeword vector by the Reed-Solomon decoder is $\tilde{r}=[\alpha^6\alpha^21\alpha0001]$. Using equations (18) and (28), the syndromes are calculated as $s_1=s_2=s_3=s_4=0$. Since the syndromes are all zero, there are no errors in the input codeword and hence the NO_ERROR flag will be set. Similarly, the syndromes for the intermediate output codeword excluding the extended symbol are zero, which indicates that at most 2 or less errors may have been corrected. However, since the NO_ERROR flag is already set, the ERR_EN will be inactive to keep the EXT_EN low (inactive). In this case, the correct extended symbol, $r\_=\alpha^6$, is the received codeword extended symbol which is appended to the intermediate output codeword, $c'=[\alpha^21\alpha0001]$. The final output codeword using equation (33) is $\tilde{c}=[\alpha^6\alpha^21\alpha0001]$.

Case 2) A singly-extended RS(8,4) Code with 1 Error

Suppose that the received codeword vector by the Reed-Solomon decoder is $\tilde{r}=[\alpha^4\alpha^21\alpha0001]$. Using equations (18) and (28), the syndromes are calculated as $s_1=0$; $s_2=0$; $s_3=0$; $s_4=\alpha^3$ which means that there are errors in the input codeword. Similarly, the syndromes for the intermediate output codeword excluding the extended symbol are all zero which indicates that at most 2 or less errors have been corrected. Since the NO_ERROR flag is not set, the CORR_ERROR and the ERR_EN flags will both be set during the 7$^{th}$ clock cycle. The extended symbol, $c\_=\alpha^6$, which is in the $s_4$ syndrome register will be multiplexed with the intermediate output codeword, $c'=[\alpha^21\alpha0001]$, using the EXT_EN signal during the 8$^{th}$ clock cycle. The final output codeword using equation (34) is $\tilde{c}=[\alpha^6\alpha^21\alpha0001]$.

Case 3) A singly-extended RS(8,4) Code with 2 Errors

Suppose that the received codeword vector by the Reed-Solomon decoder is $\tilde{r}=[\alpha^4\alpha^21\alpha000\alpha]$. Using equations (18) and (28), the syndromes are calculated as $s_1=\alpha^2$; $s_2=\alpha$; $s_3=1$; $s_4=\alpha^4$ which means that there are errors in the input codeword. Similarly, the syndromes for the intermediate output codeword excluding the extended symbol are all zero which indicates that at most 2 or less errors may have been corrected. Since the NO_ERROR flag is not set, the CORR_ERROR and the ERR_EN flags will both be set during the 7$^{th}$ clock cycle. The extended symbol, $c\_=\alpha^6$, which is in the $S_4$ syndrome register will be multiplexed with the intermediate output codeword, $c'=[\alpha^21\alpha0001]$, using the EXT_EN signal during the 8$^{th}$ clock cycle. The final output codeword using equation (34) is $\tilde{c}=[\alpha^6\alpha^21\alpha0001]$.

Case 4) A singly-extended RS(8,4) Code with 3 Errors

Suppose that the received codeword vector by the Reed-Solomon decoder is $\tilde{r}=[\alpha^4\alpha^2\alpha\alpha000\alpha]$. Using equations (18) and (28), the syndromes are calculated as $s_1=\alpha$; $s_2=\alpha^6$; $s_3=\alpha^2$; $s_4=\alpha^5$ which means that there are errors in the input codeword. Similarly, the syndromes for the intermediate output codeword excluding the extended symbol are $s_1=\alpha$; $s_2=\alpha^6$; $s_3=\alpha^2$; $s_4=1$ which indicates that more than 2 errors exist in the input codeword. The ERR_EN stays inactive in order to keep the EXT_EN low (inactive). In this case, the UNCOR_ERROR flag will be set. The extended symbol, $r\_=\alpha^4$, is the received codeword extended symbol which is appended to the intermediate output codeword, $c'=[\alpha^2\alpha\alpha000\alpha]$. Using equation (35), the final output codeword is $\tilde{c}=[\alpha^4\alpha^2\alpha\alpha000\alpha]$.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An extended symbol Galois field error correcting device, comprising:

a singly-extended Reed-Solomon encoder configured to generate an encoded codeword, $\tilde{c}(x)$;

a channel medium signal coupled with the singly-extended Reed-Solomon encoder and configured to receive the encoded codeword, $\tilde{c}(x)$, and output a received input codeword, $\tilde{r}(x)$, the channel medium capable of introducing error, $\tilde{e}(x)$, to the encoded codeword, $\tilde{c}(x)$; and a singly-extended Reed-Solomon decoder coupled with the channel medium and configured to receive the received input codeword, $\tilde{r}(x)$, the singly-extended Reed-Solomon decoder having error detection circuitry and extended symbol correction circuitry, the error detection circuitry configured to detect presence of error, $\tilde{e}(x)$, within the received input codeword, $\tilde{r}(x)$, and the extended symbol correction circuitry configured to correct the received input codeword, $\tilde{r}(x)$, by computing syndromes of an intermediate output codeword ($c'_j$), a corrected extended parity symbol ($c\_$) being provided such that the corrected extended symbol ($c\_$) is multiplexed with the intermediate output codeword ($c'_j$) to yield a final output codeword, $\tilde{c}=[c\_c']$.

2. The error correcting device of claim 1 wherein the corrected extended parity symbol ($c\_$) is provided in an ($s_{n-k+1}$) output syndrome register latched onto the (n−1)th clock cycle such that, during the (n)th clock cycle, the corrected extended-symbol ($c\_$) is multiplexed with the output codeword ($c'_j$) to yield a final output codeword, $\tilde{c}=[c\_c']$.

3. The error correcting device of claim 1 wherein the singly-extended Reed-Solomon encoder implements forward error correction.

4. The error correcting device of claim 1 wherein the channel medium comprises a signal transmission line.

5. The error correcting device of claim 1 wherein the singly-extended Reed-Solomon decoder comprises error detection logic elements.

6. The error correcting device of claim 1 wherein the singly-extended Reed-Solomon decoder comprises syndrome computation circuitry.

7. The error correcting device of claim 6 wherein the singly-extended Reed-Solomon decoder further comprises a buffer.

8. The error correcting device of claim 1 wherein the singly-extended Reed-Solomon decoder comprises standard error values computation circuitry.

9. The error correcting device of claim 1 wherein the singly-extended Reed-Solomon decoder comprises an (n+1, k) maximum-distance separable (MDS) code.

10. The error correcting device of claim 1 wherein the error detection circuitry comprises output detection logic elements of an output detection circuit, the output detection logic elements configured to detect presence of error, $\tilde{e}(x)$, within the received codeword, $\tilde{r}_j$, by evaluating whether all the syndromes ($s_1 s_2 \ldots s_{n-k}$) of the output codeword, $\tilde{r}_j$, are all zero.

11. The error correcting device of claim 1 wherein the error detection circuitry is operative to indicate whether errors have occurred in the received input codeword, $\tilde{r}(x)$.

12. The error correcting device of claim 1 wherein the corrected extended symbol, $c\_$, is generated by evaluating codeword $c(x)$ such that $c\_{=c(\alpha^{n-k+1})}$.

13. The error correcting device of claim 1 wherein the corrected extended symbol, $c\_$, produces a singly-extended Reed-Solomon (n+1,k) code usable to form a last symbol of a transmitted Reed-Solomon codeword having a length (n+1).

14. The error correcting device of claim 1 wherein the extended symbol correction circuitry computes the syndromes, $s_j$, where $s_j=r(\alpha^j)$ for j=1,2, . . . , (n−k) where $\alpha^j$ is an arbitrary Galois Field element, and the extended syndrome, $S_{n-k+1}$, where:

$$S_{n-k+1} = r\_ + \sum_{j=0}^{n-1} r_j \alpha^{j(n-k+1)}.$$

15. The error correcting device of claim 1 wherein the extended symbol correction circuitry computes the syndromes, $s_j$, where $S=rH^T=[S_1 S_2 \ldots S_{n-k}]$ and where H is the parity matrix and r is the received codeword, and the extended syndrome, $S_{n-k+1}$, where $\tilde{S}=\tilde{r}\tilde{H}^T=[S_1 S_2 \ldots S_{n-k} S_{n-k+1}]$ and where $\tilde{H}$ is the parity matrix of a singly-extended RS decoder and $\tilde{r}$ is the received codeword.

16. A Reed-Solomon decoder, comprising:

error detection circuitry configured to receive an input codeword and operative to detect presence of error within the input codeword;

is extended symbol correction circuitry coupled with the error detection circuitry and configured to correct the input codeword by computing syndromes of an intermediate output codeword; and a multiplexer associated with the extended symbol correction circuitry;

wherein the extended symbol correction circuitry causes a corrected extended parity symbol to be provided in an output syndrome register associated with an (n−1)th clock cycle such that, during the (n)th clock cycle, the corrected extended parity symbol is multiplexed with the output codeword to yield a final output codeword.

17. The Reed-Solomon decoder of claim 16 wherein the error detection circuitry and extended symbol correction circuitry cooperate to form a singly-extended Reed-Solomon decoder.

18. The Reed-Solomon decoder of claim 16 wherein the error detection circuitry is configured to receive the input codeword from a channel medium, the channel medium capable of introducing error to an encoded codeword being transmitted therethrough.

19. The Reed-Solomon decoder of claim 16 wherein the Reed-Solomon decoder comprises a singly-extended Reed-Solomon decoder configured to implement an (n+1,k) maximum-distance separable (MDS) code.

20. The Reed-Solomon decoder of claim 16 further comprising syndrome computation circuitry operative to calculate syndromes of the input codeword of a standard Reed-Solomon decoder, and an extended syndrome of the input codeword.

21. The Reed-Solomon decoder of claim 16 further comprising standard error values computation circuitry.

22. The Reed-Solomon decoder of claim 16 wherein the error detection circuitry and the extended symbol circuitry are implemented with processing circuitry.

23. The Reed-Solomon decoder of claim 16 further comprising error detection logic elements.

24. A digital data processing system, comprising:

receiving circuitry configured to receive an encoded codeword, $c(x)$;

processing circuitry configurable to evaluate the received encoded codeword, $c(x)$, for $\alpha^{(n-k+1)}$ and generate an encoded extended symbol ($c\_$) and output a final encoded codeword, $\tilde{c}=[c\_c]$; and error detecting/correcting circuitry communicating with the processing circuitry and operative to implement a Reed-Solomon decoder, the implemented Reed-Solomon decoder configured to receive the final encoded codeword, $\tilde{c}=[c\_c]$ and operative to correct the received input codeword, $\tilde{r}=[r\_r]$.

25. The digital data processing system of claim 23 wherein the error detecting/correcting circuitry, when correcting the received input codeword, $\tilde{r}=[r\_r]$, excludes the extended symbol $r\_$.

* * * * *